US007020007B2

(12) United States Patent
Kwon

(10) Patent No.: US 7,020,007 B2
(45) Date of Patent: Mar. 28, 2006

(54) NON-VOLATILE STATIC RANDOM ACCESS MEMORY

(75) Inventor: Sung Woo Kwon, Incheon (KR)

(73) Assignee: Dongbu Anam Semiconductor, Inc., Seoul (KR)

(*) Notice: Subject to any disclaimer, the term of this patent is extended or adjusted under 35 U.S.C. 154(b) by 0 days.

(21) Appl. No.: 11/023,259

(22) Filed: Dec. 27, 2004

(65) Prior Publication Data

US 2005/0141267 A1 Jun. 30, 2005

(30) Foreign Application Priority Data

Dec. 26, 2003 (KR) ..................... 10-2003-0097914

(51) Int. Cl.
*G11C 11/00* (2006.01)

(52) U.S. Cl. ............ 365/154; 365/185.08; 365/185.07; 365/185.01

(58) Field of Classification Search ................ 365/154, 365/185.08, 185.07, 185.01
See application file for complete search history.

(56) References Cited

U.S. PATENT DOCUMENTS 5,602,776 A * 2/1997 Herdt et al. ........... 365/185.08
5,986,932 A * 11/1999 Ratnakumar et al. .. 365/185.07

* cited by examiner

*Primary Examiner*—Richard Elms
*Assistant Examiner*—N Nguyen
(74) *Attorney, Agent, or Firm*—Hanley, Flight & Zimmerman, LLC

(57) ABSTRACT

Non-volatile SRAMs having an improved recall characteristic are disclosed. An illustrated non-volatile SRAM includes a plurality of unit memory cells arranged in an array. Each of the plurality of unit memory cells comprises a SRAM unit and a non-volatile circuit. The non-volatile circuit includes storage transistors, SONOS transistors connected to the storage transistors, and recall transistors connected to the SONOS transistors. The thickness of the gate insulation films of the recall transistors is thinner than the thickness of the gate insulation films of the storage transistors.

16 Claims, 2 Drawing Sheets

NON-VOLATILE STATIC RANDOM ACCESS MEMORY

FIELD OF THE DISCLOSURE

The present disclosure relates generally to non-volatile static random access memory (SRAM), and, more particularly, to non-volatile SRAM having an improved recall characteristic.

BACKGROUND

In recent years, non-volatile static random access memories (NVSRAM) have been widely used. NVSRAM does not lose the data stored therein even when the power to the NVSRAM is interrupted. A pixel unit of an NVSRAM includes a non-volatile circuit configured as a non-volatile memory element for maintaining non-volatile data, and an SRAM configured as a volatile memory element for performing read and write operations of volatile data.

FIG. 1 is a schematic equivalent circuit diagram of a unit memory cell of an NVSRAM. Referring to FIG. 1, the memory cell 10 includes an SRAM 12 and a pair of non-volatile memory circuits 14. The SRAM 12 is implemented by a pair of transistors 16, 18, which are cross-coupled.

The drain electrodes of the transistors 16, 18 are respectively connected to a data true node 20 and a data complement node 22. The output signals of opposite data levels (i.e., true and complement levels) are output from the SRAM 12 to the data true node 20 and the data complement node 22.

For purpose of explanation, the data levels at the nodes 20, 22 are referred to herein as a data true (DT) level and a data complement (DC) level, respectively. A load resistor 24 is connected between the data true node 20 and a signal line 23 which is, in turn, coupled to an internal power source Vstore for the SRAM 12. A load resistor 26 is connected between the data complement node 22 and the signal line 23, which, as previously mentioned, is connected to the internal power source Vstore.

Accesses to the data nodes 20, 22 are made via access transistors 30, 32, respectively. The channel of the access transistors 30 is connected between the data node 20 and a signal line BT. The channel of the access transistors 32 is connected between the data node 22 and a signal line BC. The signal line BT is a bit line for a DT signal. The signal line BC is a bit line for a DC signal.

The bit lines BT and BC extend to all overlapping cells in a single vertical column in a memory cell array. Each vertical column of the cells has a pair of bit lines in common. The conductive state of the access transistors 30, 32 is controlled by a signal applied to a signal line WL. The signal line WL is a word line connected in common to the gate terminals of the access transistors 30, 32 and to the gate terminals of all the other access transistors in all the overlapping cells in a single row.

Each of the non-volatile circuits 14 is connected a respective one of the data nodes 20, 22. Each non-volatile circuit 14 stores data of its respective data node (20 or 22) such that the stored data is not volatile, even when power to the NVSRAM is interrupted. Each of the non-volatile circuits 14 selectively couples a power source VCCP to its respective data node (20 or 22) through a signal line 39.

The non-volatile circuits 14 include recall NMOS transistors 40*a*, 42*a*, storage NMOS transistors 40*c*, 42*c* (each of which is a switching device), and programmable SONOS transistors 40*b*, 42*b* connected between the recall NMOS transistors 40*a*, 42*a* and the storage NMOS transistors 40*c*, 42*c*. In FIG. 1, three transistors 40*a*, 40*b* and 40*c* of a first non-volatile circuit 14 form a first tri-gate transistor, and three transistors 42*a*, 42*b* and 42*c* of a second non-volatile circuit 14 form a second tri-gate transistor. Alternatively, MONOS transistors (which have gate electrodes made of metal) may be used instead of the SONOS transistors 40*b*, 42*b* (which have gate electrodes made of polysilicon).

The recall transistors 40*a*, 42*a* are controlled by a signal Vrecall applied to their gate electrodes through a signal line 44. The SONOS transistors 40*b*, 42*b* are controlled by a signal Vsonos applied to their gate electrodes through a signal line 46. The storage transistors 40*c*, 42*c* are controlled by a signal Vstore applied to their gate electrodes through the signal line 23.

The gate electrodes of the transistors 40*a*, 40*b*, 40*c*, 42*a*, 42*b* and 42*c* in the non-volatile circuits 14 are connected to separate signals to enhance the reliability when the SONOS transistors 40*b*, 42*b* are erased or programmed during a store operation and when data is recalled from the SONOS transistors 40*b*, 42*b* to the SRAM 12 during a recall operation. The store operation refers to an operation where data stored in the SRAM 12 is quickly moved to, and stored in, the non-volatile circuits 14 when an external power source is turned off. The recall operation refers to an operation where the data stored in the non-volatile circuits 14 are quickly recalled to the SRAM 12 when the external power source is turned on. In more detail, the store operation uses a dynamic write inhibition (DWI) method, which is selectively performed depending on whether the DT level or the DC level is high or low.

For example, when the DC level is low and the transistor 42*c* is turned on by the signal Vstore, a source electrode 42*bc* of the SONOS transistor 42*b* has a low level potential. In this condition, when a program voltage is applied to a gate electrode of the SONOS transistor 42*b* through the signal Vsonos, tunneling occurs due to a potential difference between the gate electrode, the source electrode, and a potential well, thereby increasing a threshold voltage of the SONOS transistor 42*b*. Accordingly, the SONOS transistor 42*b* can be easily programmed.

When the DC level is low, the DT level is high. Thus, when the transistor 40*c* is turned on by the signal Vstore, the source electrode 40*bc* of the SONOS transistor 40*b* has a high level potential. In this condition, when a program voltage is applied to a gate electrode of the SONOS transistor 40*b* through the signal Vsonos, a potential difference between the gate electrode, the source electrode, and a potential well is not generated. Accordingly, the SONOS transistor 40*b* is not programmed.

In an effort to enhance the DWI characteristic, the threshold voltages of the storage transistors 40*c*, 42*c* and the recall transistors 40*a*, 40*c* have been raised. One proposed method for raising the threshold voltage is to increase the thickness of the gate oxide films of the storage transistors 40*c*, 42*c* and the recall transistors 40*a*, 42*a*.

However, this method is disadvantageous in that the margin and stability of the erase operation is deteriorated by simultaneously increasing the thickness of the gate oxide films of the storage transistors 40*c*, 42*c* and the thickness of the gate oxide films of the recall transistors 40*a*, 42*a*.

BRIEF DESCRIPTION OF THE DRAWINGS

In the drawings and the accompanying written description, the same or similar elements are denoted by the same reference numerals.

DETAILED DESCRIPTION

Figure 1:
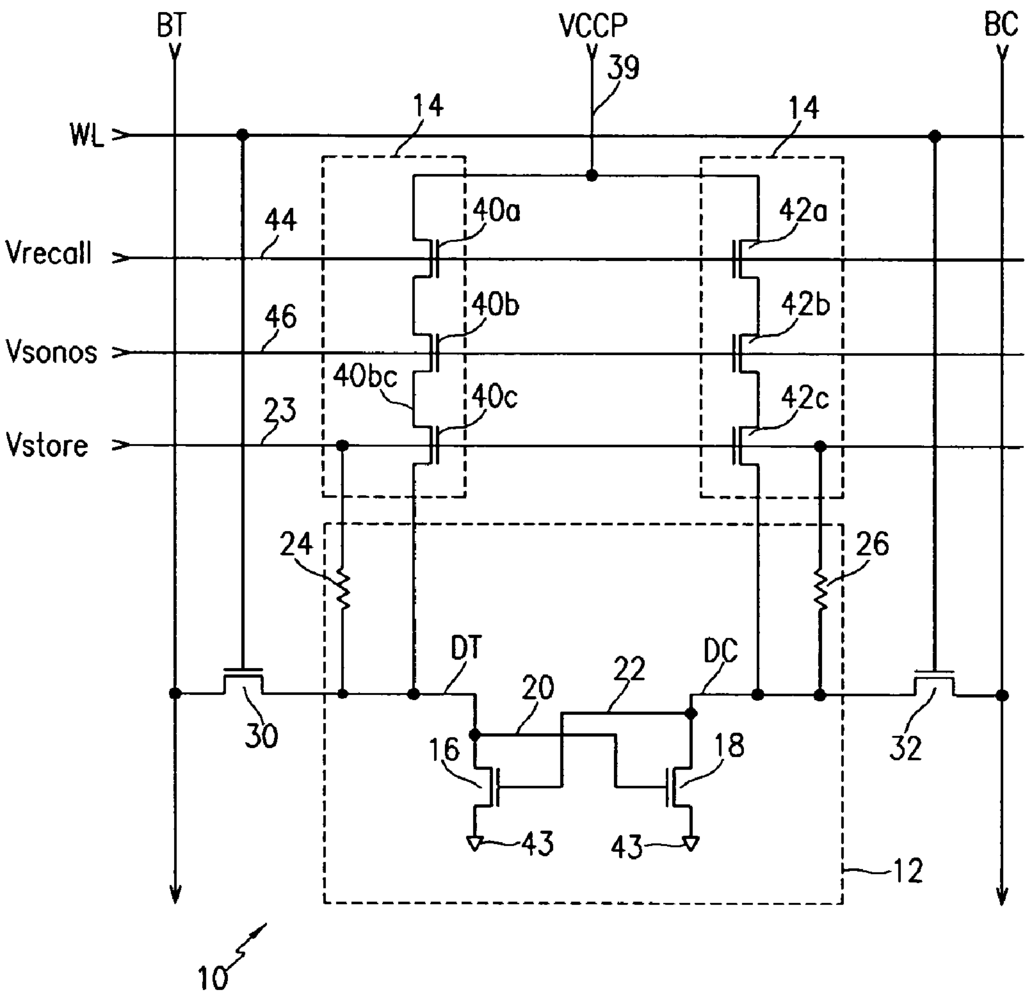
FIG. 1 is a schematic equivalent circuit diagram of a unit memory cell of a prior art NVSRAM.

The recall operation of the NVSRAM will now be described in more detail with reference to FIG. 1.

The recall operation is an operation where current flowing out of the non-volatile circuits 14 is respectively applied to the data nodes 20, 22 of the SRAM 12 simultaneously. In the following, an example in which the SONOS transistor 40*b* is not programmed and the SONOS transistor 42*b* is programmed will be described.

When the three transistors 40*a*, 40*b* and 40*c* are turned on by the signals Vrecall, Vsonos and Vstore, respectively, since the SONOS transistor 40*b* is in a non-programmed state, current flows through the three transistors 40*a*, 40*b* and 40*c* and, accordingly the power source VCCP is applied to the data node 20 to thereby make the DT level high.

On the other hand, even when the signals Vrecall, Vsonos and Vstore are respectively applied to the gate electrodes of the three transistors 42*a*, 42*b* and 42*c* as turn-on signals, since the SONOS transistor 42*b* is in a programmed state, current does not flow through the SONOS transistor 42*b*, just as if the SONOS transistor 42 b was in a turned-off state. Accordingly, the VCCP voltage is not applied to the data node 22, and the DC level goes low.

If the external power source is turned off, and then turned on again later, the data stored in the nodes 20, 22 before the external power is turned off is recalled from the non-volatile circuits 14 to the SRAM 12. In order to recall the data stored in the non-volatile circuits 14 to the SRAM 12 quickly in such a recall operation, it is important to charge the data nodes 20, 22 quickly by quickly flowing current through the three transistors of the non-volatile circuits 14 to the data nodes 20, 22. This end may be achieved by increasing the current flowing through the transistors.

On the other hand, in order to improve the DWI characteristic during the store operation, the gate oxide films of the storage transistors 40*c*, 42*c* and the recall transistors 40*a*, 42*a* are thickly formed. However, the transistors which are actually involved in the store operation are the storage transistors 40*c*, 42*c* and the SONOS transistors 40*b*, 42*b*. The recall transistors are not involved in the store operation since they are turned off during the store operation. Accordingly, the DWI characteristic can be maintained even when the gate oxide films of the recall transistors 40*a*, 42*a* are thinly formed in order to lower the threshold voltages and the conductivities of the recall transistors 40*a*, 42*a* to thereby improve the recall characteristic.

Figure 2:
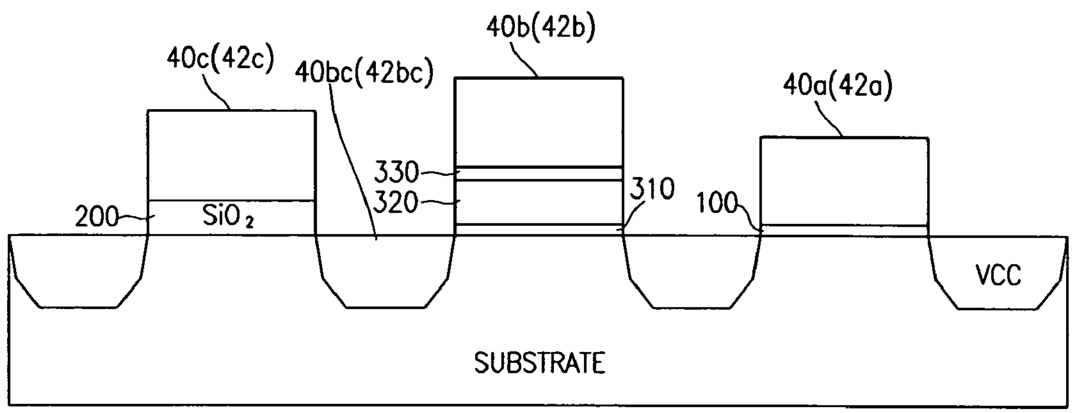
FIG. 2 is a cross-sectional view illustrating an example stack structure of three transistors 40*a*, 40*b* and 40*c* constructed in accordance with the teachings of the present invention.

FIG. 2 is a cross-sectional view illustrating an example stack structure of the three transistors 40*a*, 40*b* and 40*c* (and 42*a*, 42*b*, and 42*c*). Referring to FIG. 2, the storage transistors 40*c*, 42*c* and the recall transistors 40*a*, 42*a* have their respective gate electrodes formed on the gate oxide films 100 and 200. A lower oxide film 310, a nitride film 320 and an upper oxide film 330 are sequentially formed on the substrate. The SONOS transistors 40*b*, 42*b* have their gate electrodes formed on the upper oxide film 330.

In the example of FIG. 2, the thickness of the gate oxide films 100 of the recall transistors 40*a*, 42*a* is thinner than that of the gate oxide films 200 of the storage transistors 40*c*, 42*c*. Accordingly, the threshold voltages of the recall transistors 40*a*, 42*a* is lowered to improve their conductivities, which results in improvement of the recall characteristic of the recall transistors 40*a*, 42*a*.

In addition, since the gate oxide films 100 of the recall transistors 40*a*, 42*a* have the same thickness as a gate oxide film of a typical NMOS transistor, they may be formed at the same time when the NMOS transistors 16, 18, 30 and 32 of the SRAM are formed. Accordingly, even when the gate oxide films of the storage transistors 40*c*, 42*c* are formed to be different in thickness from those of the recall transistor 40*a*, 42*a*, an additional process is not required to manufacture the NVSRAM.

As is apparent from the above description, in the illustrated NVSRAM, the thickness of the gate oxide films 100 of the recall transistors 40*a*, 42*a* is thinly formed and the thickness of the gate oxide films 200 of the storage transistors 40*c*, 42*c* is thickly formed. Accordingly, the recall characteristic of the recall transistors 40*a*, 42*a* is improved such that the recall operation is performed stably while the DWI characteristic of the storage transistors 40*c*, 42*c* is well maintained. Moreover, the margin of the recall operation can be sufficiently secured.

In addition, even when the gate oxide films 100 of the recall transistors 40*a*, 42*a* are formed to be different in thickness from those of the storage transistors 40*c*, 42*c*, since the recall transistors 40*a*, 42*a* are formed to have the same thickness as the gate oxide film of the typical NMOS transistor of the SRAM, an additional manufacturing process is not required.

From the foregoing, persons of ordinary skill in the art will appreciate that non-volatile SRAMs having an improved recall characteristic have been disclosed. A disclosed non-volatile SRAM includes a plurality of unit memory cells arranged in an array. Each of the plurality of unit memory cells comprises an SRAM unit including first and second transistors 16, 18 which are cross-coupled to one another, a data true node 20 to which a control electrode of the first transistor 18 and a drain electrode of the second transistor 16 are connected, and a data complement node 22 to which a control electrode of the second transistor 16 and a drain electrode of the first transistor 18 are connected. Each unit memory cell also includes a non-volatile circuit 14 including first and second storage transistors 40*c*, 42*c* connected to the data true node 20 and the data complement node 22, respectively. The first and second storage transistors 40*c*, 42*c* are switched in response to a change in state of the power supplied to the SRAM unit. The non-volatile circuit 14 also includes first and second data storage elements 40*b*, 42*b* connected to the first and second storage transistors 40*c*, 42*c*, respectively. The first and second data storage elements 40*b*, 42*b* store data from the data true node 20 and the data complement node 22, respectively, in response to the interruption of the supply of power to the SRAM unit. The non-volatile circuit 14 also includes first and second data recall transistors 40*a*, 42*a* connected to the first and second data storage elements 40*b*, 42*b*, respectively. The first and second data recall transistors 40*a*, 42*a* are switched to recall the data stored in the first and second data storage elements 40*b*, 42*b*, respectively, in response to starting the supply of power to the SRAM unit. The thickness of the gate insulation films 100 of the first and second recall transistors 40*a*, 42*a* is thinner than that of gate insulation films 200 of the first and second storage transistors 40*c*, 42*c*.

Preferably, the thickness of gate insulation films 100 of the first and second recall transistors 40*a*, 42*a* is approximately equal to that of gate insulation films of the first and second transistors 16, 18 of the SRAM unit.

Preferably, the gate insulation films are gate oxide films.

Preferably, the first and second data storage elements 40*b*, 42*b* are SONOS transistors.

Preferably, the first and second storage transistors 40*c*, 42*c* and the first and second recall transistors 40*a*, 42*a* are N-type MOS transistors.

Persons of ordinary skill in the art will further appreciate that non-volatile storage circuits for storing data stored in a memory cell as non-volatile data have been disclosed. A disclosed circuit includes a storage transistor connected to a data node of the memory cell and operated in response to a first control signal such that data of the data node is stored. The circuit also includes a data storage element connected to the storage transistor and operated in response to a second control signal such that the data of the data node is stored. In addition, the circuit includes a recall transistor connected to the data storage element and operated in response to a third control signal such that data of the data node is recalled to the memory cell. The thickness of a gate insulation film of the storage transistor is thicker than that of a gate insulation film of the recall transistor.

Preferably, the data storage element includes a gate insulation film with a first oxide film, a nitride film, and a second oxide film, which are sequentially formed.

Preferably, the gate insulation film of the recall transistor is an oxide film and has the same thickness as the first oxide film.

Preferably, when the data of the memory cell is stored, the first and second control signals are applied to the storage transistor and the data storage element, respectively, as turn-on signals.

Preferably, when the data stored in the data storage element is recalled to the memory cell, the first, second and third control signals are applied to the storage transistor, the data storage element, and the recall transistor, respectively, as turn-on signals.

It is noted that this patent claims priority from Korean Patent Application Serial Number 10-2003-0097914, which was filed on Dec. 26, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A non-volatile SRAM including a plurality of unit memory cells arranged in an array, wherein each of the plurality of unit memory cells comprises:

an SRAM unit including first and second transistors which are cross-coupled, a data true node to which a control electrode of the first transistor and a drain electrode of the second transistor are connected, and a data complement node to which a control electrode of the second transistor and a drain electrode of the first transistor are connected; and a non-volatile circuit including first and second storage transistors connected to the data true node and the data complement node, respectively, the first and second storage transistors being switched in response to a change in state of power supplied to the SRAM unit, first and second data storage elements respectively connected to the first and second storage transistors to respectively store data from the data true node and the data complement node in response to interruption of the power supplied to the SRAM unit, and first and second data recall transistors respectively connected to the first and second data storage elements, the first and second data recall transistors being switched to respectively recall the data stored in the first and second data storage elements in response to supply of power to the SRAM unit, wherein a thickness of gate insulation films of the first and second recall transistors is thinner than a thickness of gate insulation films of the first and second storage transistors.

2. A non-volatile SRAM as defined in claim 1, wherein the thickness of the gate insulation films of the first and second recall transistors is approximately equal to a thickness of gate insulation films of the first and second transistors of the SRAM unit.

3. A non-volatile SRAM as defined in claim 1, wherein the gate insulation films are gate oxide films.

4. A non-volatile SRAM as defined in claim 1, wherein the first and second data storage elements are SONOS transistors.

5. A non-volatile SRAM as defined in claim 1, wherein the first and second data storage elements are MONOS transistors.

6. A non-volatile SRAM as defined in claim 1, wherein the first and second storage transistors and the first and second recall transistors are N-type MOS transistors.

7. A non-volatile storage device to store data stored in a memory cell as non-volatile data, comprising:

a storage transistor connected to a data node of the memory cell and responsive to a first control signal such that data of the data node is stored in the non-volatile storage device;

a data storage element connected to the storage transistor and responsive to a second control signal to store the data of the data; and a recall transistor connected to the data storage element and responsive to a third control signal such that data is recalled to the data node, wherein a thickness of a gate insulation film of the storage transistor is thicker than a thickness of a gate insulation film of the recall transistor.

8. A non-volatile storage device as defined in claim 7, wherein the data storage element includes a gate insulation film comprising a first oxide film, a nitride film, and a second oxide film.

9. A non-volatile storage device as defined in claim 8, wherein the gate insulation film of the recall transistor is an oxide film which has substantially the same thickness as the first oxide film.

10. A non-volatile storage device as defined in claim 7, wherein, when the data of the data node is stored in the non-volatile storage device, the first and second control signals are respectively applied to the storage transistor and the data storage element as turn-on signals.

11. A non-volatile storage device as defined in claim 7, wherein, when the data stored in the data storage element is recalled, the first, second and third control signals are respectively applied to the storage transistor, the data storage element, and the recall transistor as turn-on signals.

12. A non-volatile SRAM including a plurality of unit memory cells arranged in an array, wherein each of the plurality of unit memory cells comprises:

an SRAM unit; and a non-volatile circuit including: (a) first and second storage transistors respectively connected to a data true node and a data complement node in the SRAM unit, (b) first and second data storage transistors respectively connected to the first and second storage transistors to respectively store data from the data true node and the data complement node in response to interruption of the power supplied to the SRAM unit, and (c) first and second data recall transistors respectively connected to the first and second data storage transistors, the first and second data recall transistors being switched to respectively recall the data stored in the first and second data storage transistors in response to supply of power to the SRAM unit, wherein a thickness of gate insulation films of the first and second recall transistors is thinner than a thickness of gate insulation films of the first and second storage transistors.

13. A non-volatile SRAM as defined in claim 12, wherein the gate insulation films are gate oxide films.

14. A non-volatile SRAM as defined in claim 12, wherein the first and second data storage transistors are SONOS transistors.

15. A non-volatile SRAM as defined in claim 12, wherein the first and second data storage transistors are MONOS transistors.

16. A non-volatile SRAM as defined in claim 12, wherein the first and second storage transistors and the first and second recall transistors are N-type MOS transistors.

* * * * *